United States Patent
Han et al.

(10) Patent No.: US 8,531,044 B2
(45) Date of Patent: Sep. 10, 2013

(54) EPOXY RESIN COMPOSITION FOR ENCAPSULATING SEMICONDUCTOR DEVICE AND SEMICONDUCTOR DEVICE ENCAPSULATED WITH AN ENCAPSULANT PREPARED FROM THE COMPOSITION

(75) Inventors: Seung Han, Uiwang-si (KR); Yun Ling, Uiwang-si (KR)

(73) Assignee: Cheil Industries, Inc., Gum-si, Kyeongsangbuk-do (KR)

( * ) Notice: Subject to any disclaimer, the term of this patent is extended or adjusted under 35 U.S.C. 154(b) by 0 days.

(21) Appl. No.: 13/338,421

(22) Filed: Dec. 28, 2011

(65) Prior Publication Data

US 2012/0168969 A1   Jul. 5, 2012

(30) Foreign Application Priority Data

Dec. 31, 2010 (KR) .......... 10-2010-0140050
Oct. 20, 2011 (KR) .......... 10-2011-0107723

(51) Int. Cl.
*H01L 23/29* (2006.01)

(52) U.S. Cl.
USPC .......... 257/793; 257/E23.119; 523/457

(58) Field of Classification Search
USPC .......... 257/793; 523/457
See application file for complete search history.

(56) References Cited

U.S. PATENT DOCUMENTS

| | | | |
|---|---|---|---|
| 6,054,222 A * | 4/2000 | Takami et al. | 428/417 |
| 6,723,452 B2 * | 4/2004 | Kimura et al. | 428/620 |
| 7,544,727 B2 * | 6/2009 | Ikezawa et al. | 523/451 |
| 7,794,623 B2 * | 9/2010 | Matayabas et al. | 252/299.01 |
| 8,008,410 B2 * | 8/2011 | Kotani et al. | 525/524 |
| 2003/0201548 A1 * | 10/2003 | Ikezawa et al. | 257/793 |
| 2005/0069715 A1 * | 3/2005 | Hayakawa et al. | 428/413 |
| 2005/0222300 A1 * | 10/2005 | Ikezawa et al. | 523/457 |
| 2006/0014873 A1 * | 1/2006 | Ikezawa et al. | 524/413 |
| 2006/0025501 A1 * | 2/2006 | Osada et al. | 523/457 |
| 2006/0214153 A1 * | 9/2006 | Ikezawa et al. | 257/40 |
| 2007/0213477 A1 * | 9/2007 | Ukawa et al. | 525/523 |
| 2010/0270664 A1 * | 10/2010 | Lee et al. | 257/666 |
| 2011/0039978 A1 * | 2/2011 | Kotani et al. | 523/218 |
| 2011/0124775 A1 * | 5/2011 | Wada | 523/457 |
| 2011/0272829 A1 * | 11/2011 | Fuke et al. | 257/793 |
| 2012/0010329 A1 * | 1/2012 | Hunter et al. | 523/457 |
| 2012/0025151 A1 * | 2/2012 | Ghoul et al. | 252/511 |
| 2012/0041102 A1 * | 2/2012 | Chun et al. | 523/456 |
| 2012/0061861 A1 * | 3/2012 | Wada | 257/793 |
| 2012/0077904 A1 * | 3/2012 | Xie et al. | 523/435 |
| 2012/0168968 A1 * | 7/2012 | Lee et al. | 257/788 |
| 2012/0199992 A1 * | 8/2012 | Tabei | 257/793 |
| 2012/0205822 A1 * | 8/2012 | Tanaka | 257/788 |

FOREIGN PATENT DOCUMENTS

WO   WO2011048765   *   4/2011

* cited by examiner

*Primary Examiner* — David Zarneke
(74) *Attorney, Agent, or Firm* — Lee & Morse, P.C.

(57) ABSTRACT

An epoxy resin composition for encapsulating a semiconductor device and a semiconductor device, the composition including an epoxy resin, a curing agent, a curing accelerator, an inorganic filler, and an additive, wherein the epoxy resin includes an epoxy resin represented by Formula 1:

[Formula 1]

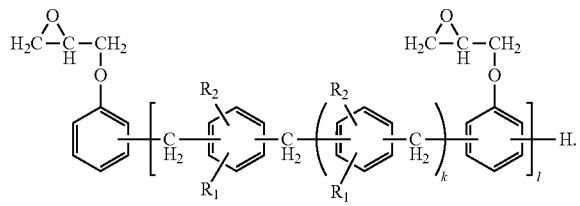

10 Claims, No Drawings

EPOXY RESIN COMPOSITION FOR ENCAPSULATING SEMICONDUCTOR DEVICE AND SEMICONDUCTOR DEVICE ENCAPSULATED WITH AN ENCAPSULANT PREPARED FROM THE COMPOSITION

BACKGROUND

1. Field

Embodiments relate to an epoxy resin composition for encapsulating a semiconductor device and a semiconductor device encapsulated with an encapsulant prepared from the composition.

2. Description of the Related Art

In the semiconductor industry, an epoxy resin composition used for encapsulating a semiconductor device should have flame retardancy satisfying UL94 V0. In order to obtain such a degree of flame retardancy, an epoxy resin composition for encapsulating a semiconductor device may be prepared using halogen and inorganic flame retardants. For example, brominated epoxy resins and antimony trioxide may be used to prepare an epoxy resin composition for encapsulating a semiconductor device to secure flame retardancy.

SUMMARY

Embodiments are directed to an epoxy resin composition for encapsulating a semiconductor device and a semiconductor device encapsulated with an encapsulant prepared from the composition.

The embodiments may be realized by providing an epoxy resin composition for encapsulating a semiconductor device, the composition including an epoxy resin; a curing agent; a curing accelerator; an inorganic filler; and an additive, wherein the epoxy resin includes an epoxy resin represented by Formula 1:

[Formula 1]

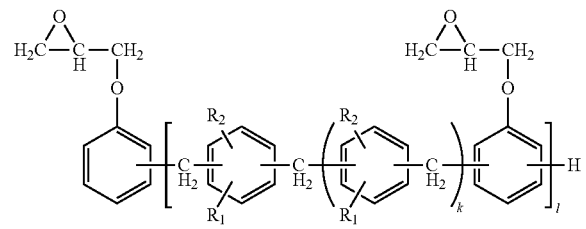

and in Formula 1, $R_1$ and $R_2$ are each independently hydrogen or a C1 to C4 linear or branched alkyl group, k has an average value of 0 to about 2, and l has an average value of about 1 to about 9.

$R_1$ and $R_2$ may each be a methyl group.

The epoxy resin represented by Formula 1 may have a structure represented by Formula 3:

[Formula 3]

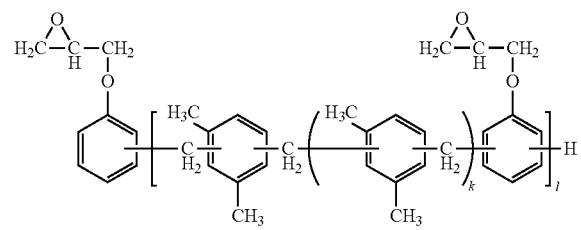

and in Formula 3, k may have an average value of 0 to about 2 and l may have an average value of about 1 to about 9.

The epoxy resin represented by Formula 1 may be present in the composition in an amount of about 1 to about 13 wt %.

The epoxy resin represented by Formula 1 may be present in the epoxy resin in an amount of about 40 wt % or more.

The epoxy resin may further include at least one selected from the group of epoxy resins obtained by epoxidation of condensates of phenols or alkyl phenols with hydroxybenzaldehyde, a phenol novolac type epoxy resin, a cresol novolac type epoxy resin, a multifunctional epoxy resin, a naphthol novolac type epoxy resin, bisphenol A/bisphenol F/bisphenol AD novolac type epoxy resins, bisphenol A/bisphenol F/bisphenol AD glycidyl ethers, a bis(hydroxyl)biphenyl epoxy resin, a dicyclopentadiene epoxy resin, a biphenyl type epoxy resin, a polycyclic aromatic modified epoxy resin, a bisphenol A epoxy resin, an ortho-cresol novolac type epoxy resin, a phenol aralkyl type epoxy resin, and a naphthalene epoxy resin.

The composition may include about 2 to about 15 wt % of the epoxy resin, about 0.5 to about 12 wt % of the curing agent, about 0.01 to about 2 wt % of the curing accelerator, about 70 to about 95 wt % of the inorganic filler, and about 0.1 to about 5 wt % of the additive.

The epoxy resin may further include one or more of an epoxy resin represented by Formula 4, an epoxy resin represented by Formula 5, and an epoxy resin represented by Formula 6:

[Formula 4]

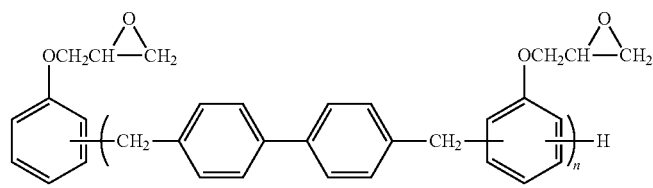

[Formula 5]

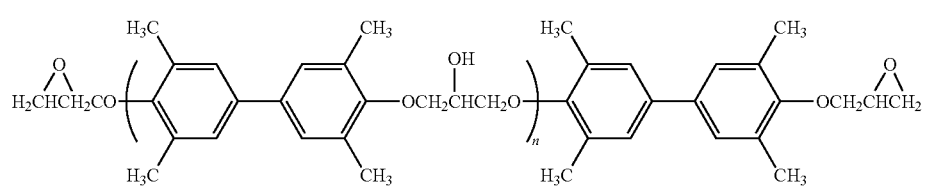

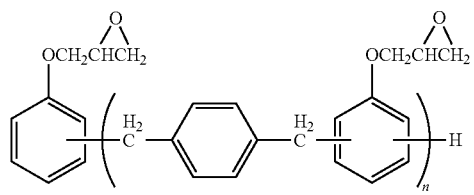

in Formula 4, n may have an average value of about 1 to about 7, in Formula 5, n may have an average value of 0 to about 7, and in Formula 6, n may have an average value of about 1 to about 9.

The curing agent may include one or more of a compound represented by Formula 7 and a compound represented by Formula 8:

[Formula 7]

[Formula 8]

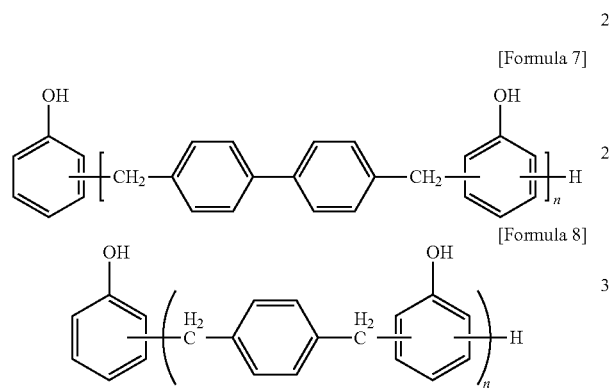

in Formula 7, n may have an average value of about 1 to about 7, and in Formula 8, n may have an average value of about 1 to about 7.

The embodiments may also be realized by providing a semiconductor device encapsulated with an encapsulant prepared from the composition according to an embodiment.

DETAILED DESCRIPTION

Korean Patent Application Nos. 10-2010-0140050, filed on Dec. 31, 2010 and 10-2011-0107723, filed on Oct. 20, 2011, in the Korean Intellectual Property Office, and entitled: "Epoxy Resin Composition for Encapsulating Semiconductor Device and Semiconductor Device Encapsulated with the Same," are incorporated by reference herein in their entirety.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when a layer or element is referred to as being "on" another element, it can be directly on the other element, or intervening elements may also be present.

An epoxy resin composition for encapsulating a semiconductor device according to an embodiment may include an epoxy resin, a curing agent, a curing accelerator, an inorganic filler, and an additive.

Epoxy Resin

The epoxy resin may include an aromatic hydrocarbon-formaldehyde resin modified novolac epoxy resin represented by the following Formula 1.

[Formula 1]

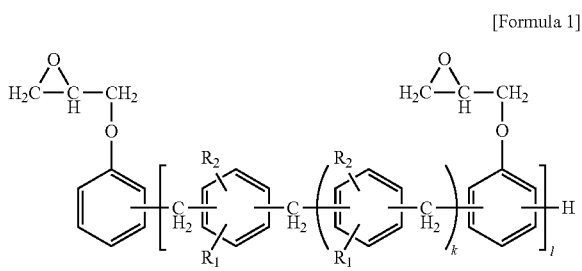

In Formula 1, $R_1$ and $R_2$ may each independently be hydrogen or a C1 to C4 linear or branched alkyl group, k may have an average value of 0 to about 2, and l may have an average value of about 1 to about 9.

In an implementation, in Formula 1, $R_1$ and $R_2$ may each be a methyl group, and the epoxy resin may have a structure represented by the following Formula 2.

[Formula 2]

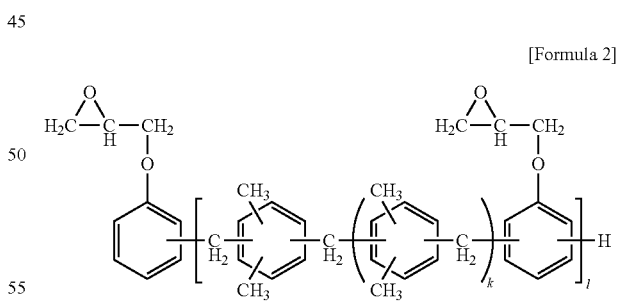

In Formula 2, k may have an average value of 0 to about 2, and l may have an average value of about 1 to about 9.

In the epoxy resin represented by Formula 1, $R_1$ and $R_2$ may be disposed at ortho, meta, or para positions, when both are alkyl. For example, the epoxy resin represented by Formula 1 may have a structure represented by the following Formula 3.

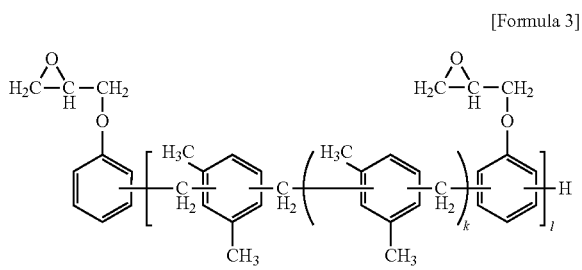

[Formula 3]

In Formula 3, k may have an average value of 0 to about 2, and l may have an average value of about 1 to about 9.

The epoxy resin may have excellent hygroscopic properties, toughness, oxidation resistance, and crack resistance, as well as low crosslink density, and thus may provide flame retardancy (to an encapsulant prepared from the composition) through formation of a char layer when burned at a high temperature.

The epoxy resin may have an epoxy equivalent weight of about 100 to about 350 g/eq. Within this range, the epoxy resin composition may achieve an excellent balance between curing performance, flame retardancy (of an encapsulant prepared from the composition), and fluidity. In an implementation, the epoxy equivalent weight may be about 200 to about 300 g/eq.

The epoxy resin may have a softening point of about 40 to about 120° C. and a melt viscosity of about 0.1 to about 3.0 poise at 150° C. Within this range, fluidity may not deteriorate when melted, and moldability of the epoxy resin composition may not deteriorate.

The epoxy resin may be synthesized by a general method or may be obtained from commercially available products. For example, YL-7683 (Mitsubishi Chemical) may be used, without being limited thereto.

The epoxy resin represented by Formula 1 may be present in the epoxy resin composition in an amount of about 1 to about 15 wt %, e.g., 1 to 13 about wt %. Within this range, the epoxy resin composition may have good fluidity and adhesion, and may provide an encapsulant having good flame retardancy, adhesion, and reliability. In an implementation, the epoxy resin represented by Formula 1 may be present in the epoxy resin composition in an amount of about 2 to about 9 wt %.

The epoxy resin composition may include an additional epoxy resin (generally used in manufacturing an epoxy resin composition) together with the epoxy resin represented by Formula 1. For example, the additional epoxy resin may include any suitable epoxy resin having at least two epoxy groups, without being particularly limited thereto. In an implementation, the additional epoxy resin may include at least one selected from the group of a monomer, an oligomer, and a polymer.

For example, the additional epoxy resin may include, without being limited to, at least one selected from the group of epoxy resins obtained by epoxidation of condensates of phenols or alkyl phenols with hydroxybenzaldehyde, a phenol novolac type epoxy resin, a cresol novolac type epoxy resin, a multifunctional epoxy resin, a naphthol novolac type epoxy resin, bisphenol A/bisphenol F/bisphenol AD novolac type epoxy resins, bisphenol A/bisphenol F/bisphenol AD glycidyl ethers, a bis(hydroxyl)biphenyl epoxy resin, a dicyclopentadiene epoxy resin, a biphenyl type epoxy resin, a polycyclic aromatic modified epoxy resin, a bisphenol A epoxy resin, an ortho-cresol novolac type epoxy resin, a phenol aralkyl type epoxy resin, and a naphthalene epoxy resin.

In an implementation, a phenol aralkyl novolac epoxy resin including a biphenyl derivative represented by Formula 4, a biphenyl epoxy resin represented by Formula 5, or a xyloc epoxy resin represented by Formula 6, may be used.

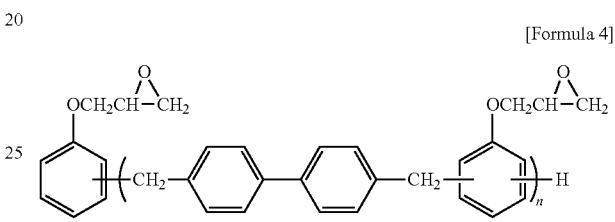

[Formula 4]

In Formula 4, n may have an average value of about 1 to about 7.

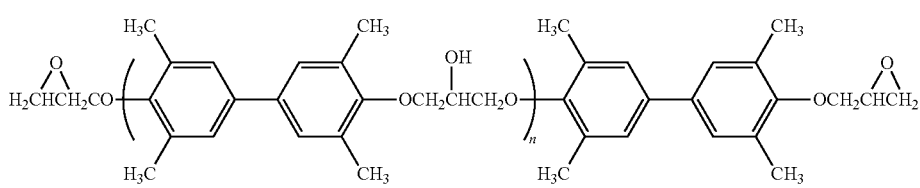

[Formula 5]

In Formula 5, n may have an average value of 0 to about 7.

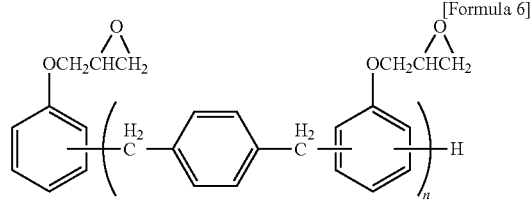

[Formula 6]

In Formula 6, n may have an average value of about 1 to about 9.

The epoxy resin may include adducts, such as a melt master batch (MMB), obtained by pre-reaction of the above-described epoxy resins with other additives, such as a curing agent, a curing accelerator, a release agent, a coupling agent, or the like.

When the epoxy resin composition includes both the epoxy resin represented by Formula 1 and the aforementioned additional epoxy resins, the epoxy resin of Formula 1 may be present in an amount of about 40 wt % or more, based on a total weight of the epoxy resin. Within this range, the epoxy resin composition may have good adhesion and fluidity and may prepare an encapsulant having good flame retardancy, adhesion, and reliability. In an implementation, the epoxy resin of Formula 1 may be present in an amount of about 50 wt % or more, e.g., about 60 to about 100 wt %, based on the total weight of the epoxy resin.

The epoxy resin of Formula 1 alone or a mixture thereof may be present in the epoxy resin composition in an amount of about 2 to about 15 wt %.

Curing Agent

The curing agent may include any suitable curing agent for semiconductor encapsulation, and may contain at least two phenolic hydroxyl groups. The curing agent may be selected from the group of monomers, oligomers, and polymers.

Examples of the curing agent may include, without being limited to, phenol aralkyl type phenolic resins, phenol novolac type phenolic resins, xyloc type phenolic resins, cresol novolac type phenolic resins, naphthol type phenolic resins, terpene type phenolic resins, multifunctional phenolic resins, polycyclic aromatic phenolic resins, dicyclopentadiene phenolic resins, terpene modified phenolic resins, dicyclopentadiene modified phenolic resins, novolac type phenolic resins synthesized from bisphenol A and resol, polyhydric phenolic compounds including tris(hydroxyphenyl)methane, dihydroxybiphenyl, acid anhydrides including maleic anhydride and phthalic anhydride, and aromatic amines including meta-phenylenediamine, diaminodiphenylmethane, and diaminodiphenylsulfone.

In an implementation, a phenol aralkyl type phenolic resin of a novolac structure containing a biphenyl derivative represented by the following Formula 7 or a xyloc type phenolic resin represented by the following Formula 8, may be used as the curing agent.

[Formula 7]

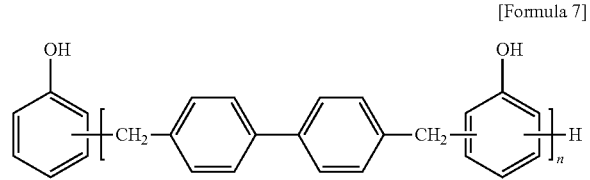

In Formula 7, n may have an average value of about 1 to about 7.

[Formula 8]

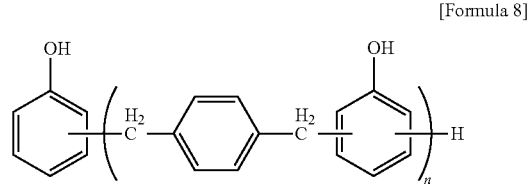

In Formula 8, n may have an average value of about 1 to about 7.

The curing agent may be used alone or in combination thereof. In an implementation, the curing agent may also be or include adducts such as an MMB, as obtained by pre-reaction of the above-described curing agents with an epoxy resin, a curing accelerator, and other additives.

As to a ratio between the epoxy resin and the curing agent, a ratio between the equivalent weight of epoxy groups in the epoxy resin and an equivalent weight of phenolic hydroxyl groups in the curing agent may be about 0.5:1 to about 2:1. Within this range, the resin composition may secure fluidity and curing may not be delayed. In an implementation, the equivalent weight ratio may be about 0.8:1 to about 1.6:1.

The curing agent may be present in the epoxy resin composition in an amount of about 0.5 to 1 about 2 wt %. In an implementation, the curing agent may be present in the epoxy resin composition in an amount of about 1 to about 10 wt %.

Curing Accelerator

The curing accelerator is a material that promotes reaction between the epoxy resin and the curing agent. The curing accelerator may include any suitable curing accelerator known in the art. For example, the curing accelerators may include tertiary amines, organometallic compounds, organic phosphorus compounds, imidazole compounds, boron compounds, or the like.

Examples of the tertiary amines may include benzyldimethylamine, triethanolamine, triethylenediamine, dimethylaminoethanol, tri(dimethylaminomethyl)phenol, 2-2-(dimethylaminomethyl)phenol, 2,4,6-tris(diaminomethyl) phenol, and salts of tri-2-ethylhexanoic acid, without being limited thereto. Examples of the organometallic compounds may include chromium acetylacetonate, zinc acetylacetonate, and nickel acetylacetonate, without being limited thereto. Examples of the organic phosphorus compounds may include tris(4-methoxy)phosphine, tetrabutylphosphonium bromide, butyltriphenylphosphonium bromide, phenylphosphine, diphenylphosphine, triphenylphosphine, triphenylphosphine triphenylborane, and triphenyl-phosphine-1, 4-benzoquinone adducts, without being limited thereto. Examples of the imidazole compounds may include 2-methylimidazole, 2-phenylimidazole, 2-aminoimidazole, 2-methyl-l-vinylimidazole, 2-ethyl-4-methylimidazole, and 2-heptadecylimidazole, without being limited thereto. Examples of the boron compounds may include tetraphenylphosphonium-tetraphenylborate, triphenylphosphine tetraphenylborate, tetraphenylboron salts, trifluoroborane-n-hexylamine, trifluoroborane monoethylamine, tetrafluoroborane triethylamine, and tetrafluoroborane amine, without being limited thereto. In addition, 1,5-diazabicyclo[4.3.0]non-5-ene (DBN), 1,8-diazabicyclo[5.4.0] undec-7-ene (DBU) and phenol novolac resin salts may be used.

Further, the curing accelerator may also be or include adducts obtained via pre-reaction with the epoxy resin or curing agent.

The curing accelerator may be present in the epoxy resin composition in an amount of about 0.01 to about 2 wt %. In an implementation, the curing accelerator may be present in the epoxy resin composition in an amount of about 0.02 to about 1.5 wt %.

Inorganic Filler

The inorganic filler may help improve mechanical properties of the epoxy resin composition while also reducing stress. Examples of the inorganic filler may include fused silica, crystalline silica, calcium carbonate, magnesium carbonate, alumina, magnesia, clay, talc, calcium silicate, titanium oxide, antimony oxide, and glass fiber, without being limited thereto. In an implementation, fused silica having a low coefficient of linear expansion may be used to help reduce stress.

Fused silica may refer to amorphous silica having a specific gravity of about 2.3 or less, which may be prepared by melting crystalline silica or by synthesis from various raw materials.

In use, the inorganic filler may be surface-treated with at least one coupling agent selected from the group of epoxy silane, aminosilane, mercaptosilane, alkyl silane, and alkoxysilane.

Although there is no particular restriction as to the shape and particle diameter of the inorganic filler, spherical fused silica having an average particle diameter of about 0.001 μm to about 30 μm may be used. Also, the inorganic filler may be a mixture of spherical fused silica having different particle diameters. For example, the fused silica mixture may include about 50 to about 99 wt % of spherical fused silica having an average particle diameter of about 5 μm to about 30 μm and about 1 to about 50 wt % of spherical fused silica having an average particle diameter of about 0.001 μm to about 1 μm.

In an implementation, the particle diameter of the inorganic filler may be adjusted to a maximum of, e.g., 45 μm, 55 μm, and/or 75 μm, depending on desired use of the resin composition and the composition of a lead frame.

The inorganic filler may be added at a suitable ratio in view of physical properties, such as moldability, stress, and temperature resistance of the epoxy resin composition. For example, the inorganic filler may be present in the epoxy resin composition in an amount of about 70 to about 95 wt %. In an implementation, the inorganic filler may be present in the epoxy resin composition in an amount of about 75 to about 92 wt %.

Additive

The epoxy resin composition may further include an additive, e.g., colorants, coupling agents, stress-reducing agents, flame retardants, crosslinking promoters, auxiliary flame retardants, leveling agents, and release agents. The additive may be present in the epoxy resin composition in an amount of about 0.01 to about 5 wt %.

Examples of the colorants may include carbon black, organic dyes, or inorganic dyes, without being limited thereto. Examples of the coupling agents may include at least one selected from the group of epoxy silane, aminosilane, mercaptosilane, alkyl silane, and alkoxysilane, without being limited thereto. Examples of the stress-reducing agents may include at least one selected from the group of modified silicone oil, a silicone elastomer, silicone powder, and a silicone resin, without being limited thereto. For example, as modified silicone oil, a silicone polymer having excellent heat resistance may be suitable and may be mixed with at least one of silicone oil having an epoxy group, silicone oil having an amine group, and silicone oil having a carboxyl group. The stress-reducing agent may be present in the epoxy resin composition in an amount of about 0.01 to about 2 wt %. Examples of the flame retardants may include organic and inorganic flame retardants, such as bromine or phosphorus flame retardants, phosphagen, zinc borate, aluminum hydroxide, and magnesium hydroxide. Examples of the release agent may include higher fatty acids, higher fatty acid metal salts, and ester waxes.

Although there is no particular restriction as to a method of preparing the epoxy resin composition, the epoxy resin composition may be prepared by uniformly mixing the components included in the composition using, e.g., a Henschel or Redige mixer, melt-kneading the mixture at about 90 to about 110° C. using a roll mill or a kneader, and cooling and grinding the mixture. As a method of encapsulating a semiconductor device using the epoxy resin composition, low-pressure transfer molding may be employed. In an implementation, injection molding or casting may be used. Using these methods, a semiconductor device having a copper lead frame, an iron lead frame, a lead frame obtained by pre-plating lead frames with at least one material selected from the group of nickel, copper, and palladium, or an organic laminate frame may be manufactured.

Another embodiment provides a semiconductor device encapsulated using the epoxy resin composition. A method of encapsulating a semiconductor device using the composition may include any suitable method.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

A description of details apparent to those skilled in the art may be omitted herein.

Details of components used in Examples 1 to 3 and Comparative Examples 1 to 3 are described as follows.

(A) Epoxy resin (a1) Aromatic hydrocarbon-formaldehyde modified novolac epoxy resin, YL-7683 (Mitsubishi Chemical)

(a2) Phenol aralkyl epoxy resin, NC-3000 (Nippon Kayaku)

(a3) Biphenyl epoxy resin, YH-4000H (Mitsubishi Chemical)

(a4) Xyloc epoxy resin, NC-2000-L (Nippon Kayaku)

(B) Curing agent (b1) Phenol arakyl phenolic resin, MEH-7851SS (Meiwa Kasei), (b2) Xyloc phenolic resin, MEH-7800SS (Meiwa Kasei)

(C) Inorganic filler: Mixture of spherical fused silica having an average particle diameter of 18 μm and spherical fused silica having an average particle diameter of 0.5 μm at a weight ratio of 9:1

(D) Curing accelerator: Triphenylphosphine (Hokko)

(E) Coupling agent (e1) Mercaptosilane, KBM-803 (Shinetsu)

(e2) Alkoxysilane, SZ-6070 (Dow Corning chemical)

(F) Release agent: Carnauba wax (G) Colorant: Carbon black, MA-600 (Matsushita Chemical)

Examples 1 to 3

Epoxy resins, curing agents, curing accelerators, inorganic fillers, coupling agents, colorants, and release agents were added according to compositions listed in Table 1, below, and uniformly mixed using a Henschel mixer. The mixture was melt-kneaded at 95 to 110° C. using a continuous kneader and then was cooled and ground, thereby producing epoxy resin compositions for encapsulating a semiconductor device.

Comparative Examples 1 to 3

Epoxy resin compositions for encapsulating a semiconductor device were prepared in the same manner as in Examples except that epoxy resins, curing agents, curing accelerators, inorganic fillers, coupling agents, colorants, and release agents were used according to compositions listed in Table 1. In Table 1, units are in wt %.

TABLE 1

| | | | Example | | | Comparative Example | | |
|---|---|---|---|---|---|---|---|---|
| | | | 1 | 2 | 3 | 1 | 2 | 3 |
| (A) | (a1) | Aromatic hydrocarbon-formaldehyde resin modified novolac | 7.15 | 6.72 | 3.22 | — | — | — |
| | (a2) | Phenol arakyl | — | — | — | 6.72 | — | — |
| | (a3) | Biphenyl | — | — | 3.22 | — | 5.89 | — |
| | (a4) | Xyloc | — | — | — | — | — | 6.44 |
| (B) | (b1) | Phenol arakyl | — | 4.98 | 2.63 | 4.98 | 5.81 | 5.26 |
| | (b2) | Xyloc | 4.55 | — | 2.63 | — | — | — |
| (C) | | Fused silica | 87.00 | 87.00 | 87.00 | 87.00 | 87.00 | 87.00 |
| (D) | | Triphenylphosphine | 0.20 | 0.20 | 0.20 | 0.20 | 0.20 | 0.20 |
| (E) | (e1) | Mercaptosilane | 0.20 | 0.20 | 0.20 | 0.20 | 0.20 | 0.20 |
| | (e2) | Alkoxysilane | 0.30 | 0.30 | 0.30 | 0.30 | 0.30 | 0.30 |
| (F) | | Carnauba wax | 0.30 | 0.30 | 0.30 | 0.30 | 0.30 | 0.30 |
| (G) | | Carbon black | 0.30 | 0.30 | 0.30 | 0.30 | 0.30 | 0.30 |

Experiment: Evaluation of Physical Properties of Epoxy Resin Compositions

Each of the epoxy resin compositions prepared in the Examples and the Comparative Examples was evaluated in terms of the following properties listed in Table 2, and the results are shown in Table 2, below.

<Evaluation Method>

1. Fluidity

A flow length of each composition was measured using a measurement mold and a transfer molding press at 175° C. and 70 kgf/cm² according to EMMI-1-66. A higher value represents better fluidity.

2. Flame Retardancy

Flame retardancy was evaluated using a cured specimen having a thickness of ⅛ of an inch according to the UL94 V-0.

3. Adhesive Strength

A copper substrate having a suitable size for a mold for measurement of adhesive strength was prepared, and specimens were prepared by pre-plating the copper sample with each of nickel-palladium-gold and nickel-palladium-gold/silver. Each of the resin compositions prepared in the Examples and the Comparative Examples was molded with each of the specimens at a mold temperature of 170 to 180° C., a transfer pressure of 1,000 psi, and a transfer rate of 0.5 to 1 cm/s for a curing time of 120 seconds, thereby preparing a cured sample. Each sample was placed in an oven at 170 to 180° C. and subjected to post-mold curing (PMC) for 4 hours and then was immediately subjected to pre-conditioning, i.e., the sample was passed through IR reflow once at 260° C. for 30 seconds, followed by measurement of adhesive strength. In addition, after PMC, the sample was left at 60° C. and 60% RH for 120 hours and then was subjected to pre-conditioning in the same manner, followed by measurement of adhesive strength. Here, an area of the epoxy resin composition in contact with the sample was 40±1 mm², and adhesive strength was obtained by measuring 12 samples per process using a universal testing machine (UTM) and calculating an average value thereof.

4. Reliability

Each of the epoxy resin compositions prepared in the Examples and the Comparative Examples was transfer molded at 175° C. for 60 seconds using a multi plunger system (MPS), thereby preparing a 256 Low-profile Quad Flat Package (LQFP, 28 mm×28 mm×1.4 mm) including a copper substrate and 256 LQFPs (28 mm×28 mm×1.4 mm) including lead frames in which a copper substrate was pre-plated with nickel-palladium-gold and nickel-palladium-gold/silver, respectively. The packages were subjected to PMC at 175° C. for 4 hours and cooled to 25° C. Then, the packages were dried at 125° C. for 24 hours, and then subjected to 5 cycles of thermal shock testing (1 cycle means that the packages were left at −65° C. for 10 minutes, at 25° C. for 10 minutes and at 150° C. for 10 minutes). Subsequently, the packages were subjected to pre-conditioning, i.e., the packages were left at 60° C. and an RH of 60% for 120 hours and then passed through IR reflow three times at 260° C. for 30 seconds, followed by observation of the packages using an optical microscope to identify whether cracks appeared. Using a non-destructive tester (Scanning Acoustic Microscopy (SAM)), occurrence of peeling of the cured epoxy resin composition from the lead frame was evaluated.

TABLE 2

| | | Example | | | Comparative Example | | |
|---|---|---|---|---|---|---|---|
| | | 1 | 2 | 3 | 1 | 2 | 3 |
| Fluidity (inch) | | 50 | 54 | 62 | 50 | 80 | 48 |
| Flame retardancy | | V-0 | V-0 | V-0 | V-0 | V-1 | V-1 |
| Adhesive strength to Cu lead frame (kgf) | PMC and reflow | 82 | 86 | 85 | 74 | 82 | 68 |
| | PMC, storage at 60° C./60% RH for 120 hours and reflow | 78 | 83 | 81 | 69 | 85 | 62 |
| Adhesive strength to Ni—Pd—Au lead frame (kgf) | PMC and reflow | 63 | 64 | 61 | 62 | 60 | 54 |
| | PMC, storage at 60° C./60% RH for 120 hours and reflow | 54 | 52 | 50 | 50 | 50 | 40 |
| Adhesive strength to Ni—Pd—Au/Ag lead frame (kgf) | PMC, reflow | 78 | 82 | 75 | 68 | 76 | 62 |
| | PMC, storage at 60° C./60% RH for 120 hours and reflow | 72 | 75 | 70 | 64 | 68 | 53 |
| Reliability Cu lead frame | Number of cracks | 0 | 0 | 0 | 0 | 0 | 0 |
| | Number of peelings | 0 | 0 | 0 | 0 | 12 | 42 |
| | Total number of semiconductor devices tested | 80 | 80 | 80 | 80 | 80 | 80 |
| Ni—Pd—Au lead frame | Number of cracks | 0 | 0 | 0 | 0 | 0 | 0 |
| | Number of peelings | 0 | 0 | 0 | 0 | 32 | 80 |
| | Total number of semiconductor devices tested | 80 | 80 | 80 | 80 | 80 | 80 |
| Ni—Pd—Au/Ag lead frame | Number of cracks | 0 | 0 | 0 | 0 | 0 | 0 |
| | Number of peelings | 0 | 0 | 0 | 1 | 3 | 12 |
| | Total number of semiconductor devices tested | 80 | 80 | 80 | 80 | 80 | 80 |

As may be seen in Table 2, the cured compositions prepared using the epoxy resin compositions according to the embodiments had good adhesion to various lead frames and good flame retardancy, as compared with the Comparative Examples. Further, the cured compositions prepared using the epoxy resin compositions according to the embodiments had a flame retardancy of V-0, as compared with the cured composition prepared using the xyloc epoxy resin (having a structure similar to that in Formula 1) according to Comparative Example 3. Also, the cured compositions according to the embodiments had good reliability, as evidenced by suitable peel resistance.

By way of summation and review, an epoxy resin composition using halogen flame retardants to secure flame retardancy may generate toxic carcinogens, such as dioxins or difurans, when combusted. Further, when combusted, the halogen flame retardants may generate gases, such as HBr and HCl, which are toxic to humans and may cause corrosion of semiconductor chips or wires and lead frames.

Accordingly, non-halogen organic flame retardants and inorganic flame retardants have been considered. As organic flame retardants, flame retardants including phosphoric flame retardants, such as phosphazene and phosphate ester, and nitrogen containing resins, have been considered. However, nitrogen containing resins may exhibit insufficient flame retardancy, and it may be necessary to use an excessive amount of the resins. Organic phosphoric flame retardants may have excellent flame retardancy and good thermal properties, and thus may be suitably applied to an epoxy resin composition for encapsulating a semiconductor device. Further, organic phosphoric flame retardants may not generate phosphoric acid and polyphosphoric acid. However, the semiconductor industry restricts use of the organic phosphoric flame retardants due to drawbacks of inorganic phosphoric flame retardants, which may form phosphoric acid and polyphosphoric acid through reaction with water, thereby deteriorating reliability.

In addition, although inorganic flame retardants, e.g., magnesium hydroxide or zinc borate, have been considered, use of such inorganic flame retardants may cause deterioration in curing properties of an epoxy resin composition, which in turn may cause deterioration in moldability.

Further, as a semiconductor device may employ not only a lead frame composed of a metal, e.g., copper and iron, but also a lead frame obtained by pre-plating the metal lead frame with at least one material selected from the group of nickel, palladium, silver and gold, there is growing demand for an epoxy resin composition having good adhesion to such lead frames and good reliability.

The embodiments provide an epoxy resin composition for encapsulating a semiconductor device, which secures excellent flame retardancy, while exhibiting suitable fluidity and good adhesion as well as reliability to various lead frames.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An epoxy resin composition for encapsulating a semiconductor device, the composition comprising:
    an epoxy resin;
    a curing agent;
    a curing accelerator;
    an inorganic filler; and
    an additive, wherein:
    the epoxy resin includes an epoxy resin represented by Formula 1:

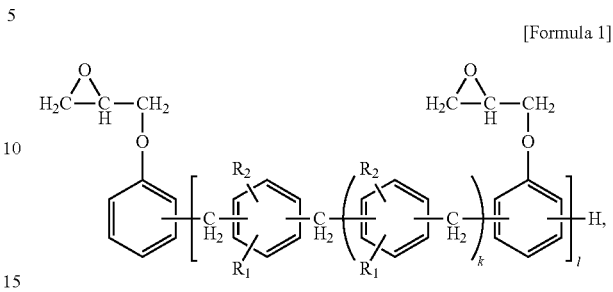

[Formula 1]

and
    in Formula 1, $R_1$ and $R_2$ are each independently hydrogen or a C1 to C4 linear or branched alkyl group, k has an average value of 0 to about 2, and l has an average value of about 1 to about 9.

2. The composition as claimed in claim 1, wherein $R_1$ and $R_2$ are each a methyl group.

3. The composition as claimed in claim 1, wherein:
    the epoxy resin represented by Formula 1 has a structure represented by Formula 3:

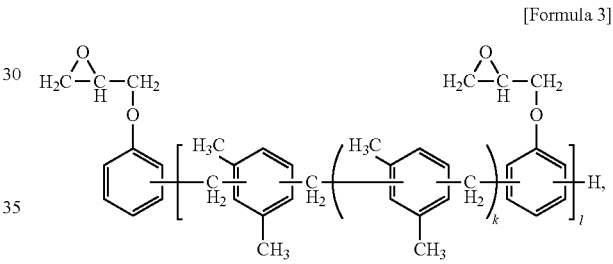

[Formula 3]

and
    in Formula 3, k has an average value of 0 to about 2 and l has an average value of about 1 to about 9.

4. The composition as claimed in claim 1, wherein the epoxy resin represented by Formula 1 is present in the composition in an amount of about 1 to about 13 wt %.

5. The composition as claimed in claim 1, wherein the epoxy resin represented by Formula 1 is present in the epoxy resin in an amount of about 40 wt % or more.

6. The composition as claimed in claim 1, wherein the epoxy resin further includes at least one selected from the group of epoxy resins obtained by epoxidation of condensates of phenols or alkyl phenols with hydroxybenzaldehyde, a phenol novolac epoxy resin, a cresol novolac epoxy resin, a multifunctional epoxy resin, a naphthol novolac epoxy resin, bisphenol A/bisphenol F/bisphenol AD novolac epoxy resins, bisphenol A/bisphenol F/bisphenol AD glycidyl ethers, a bis (hydroxyl)biphenyl epoxy resin, a dicyclopentadiene epoxy resin, a biphenyl epoxy resin, a polycyclic aromatic modified epoxy resin, a bisphenol A epoxy resin, an ortho-cresol novolac epoxy resin, a phenol aralkyl epoxy resin, and a naphthalene epoxy resin.

7. The composition as claimed in claim 1, wherein the composition includes:
    about 2 to about 15 wt % of the epoxy resin,
    about 0.5 to about 12 wt % of the curing agent,
    about 0.01 to about 2 wt % of the curing accelerator,
    about 70 to about 95 wt % of the inorganic filler, and
    about 0.1 to about 5 wt % of the additive.

8. The composition as claimed in claim 7, wherein:
    the epoxy resin further includes one or more selected from the group of an epoxy resin represented by Formula 4, an epoxy resin represented by Formula 5, and an epoxy resin represented by Formula 6:

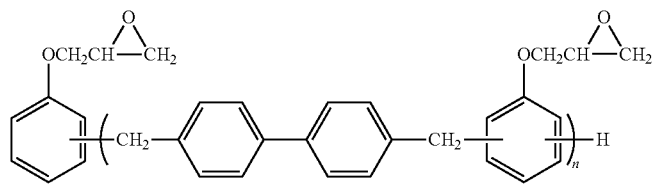
[Formula 4]

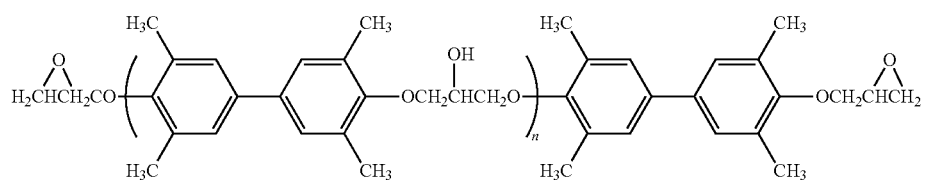
[Formula 5]

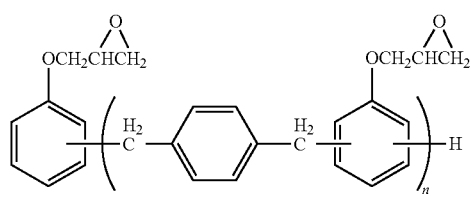
[Formula 6]

in Formula 4, n has an average value of about 1 to about 7,
in Formula 5, n has an average value of 0 to about 7, and
in Formula 6, n has an average value of about 1 to about 9.

9. The composition as claimed in claim 7, wherein:
the curing agent includes one or more selected from the group of a compound represented by Formula 7 and a compound represented by Formula 8:

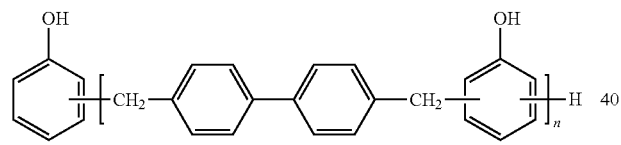
[Formula 7]

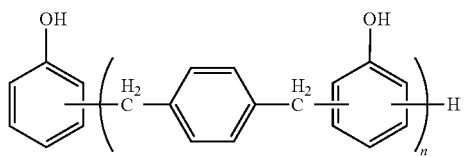
-continued
[Formula 8]

in Formula 7, n has an average value of about 1 to about 7, and in Formula 8, n has an average value of about 1 to about 7.

10. A semiconductor device encapsulated with an encapsulant prepared from the composition as claimed in claim 1.

* * * * *